(12) United States Patent
Terada et al.

(10) Patent No.: US 7,910,157 B2
(45) Date of Patent: Mar. 22, 2011

(54) SUBSTRATE PROCESSING METHOD AND PROGRAM

(75) Inventors: Shouichi Terada, Koshi (JP); Tsuyoshi Mizuno, Koshi (JP); Takeshi Uehara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1131 days.

(21) Appl. No.: 11/611,632

(22) Filed: Dec. 15, 2006

(65) Prior Publication Data
US 2007/0150112 A1 Jun. 28, 2007

(30) Foreign Application Priority Data

Dec. 27, 2005 (JP) ................... 2005-375449

(51) Int. Cl.
*H05K 3/22* (2006.01)
*H05K 3/26* (2006.01)
*H05K 3/00* (2006.01)

(52) U.S. Cl. ........ 427/99.3; 427/58; 427/98.6; 427/331; 427/355; 427/359; 427/372.2; 427/379; 427/553; 427/558; 427/532; 427/96.1; 427/97.1; 427/97.6; 451/56; 451/65; 451/66; 451/28; 451/64; 451/283; 451/285; 451/287

(58) Field of Classification Search ................. 427/99.3, 427/372.2, 359, 355, 96.1, 97.1, 343, 344, 427/379, 397.7
See application file for complete search history.

(56) References Cited

U.S. PATENT DOCUMENTS

| 4,105,816 | A | * | 8/1978 | Hori ............................... 428/159 |
| 5,571,560 | A | * | 11/1996 | Lin ................................. 427/240 |
| 6,399,897 | B1 | * | 6/2002 | Umematsu et al. ............ 174/261 |
| 2001/0046751 | A1 | * | 11/2001 | Walker et al. .................. 438/400 |
| 2003/0134570 | A1 | * | 7/2003 | Hakomori .......................... 451/5 |
| 2004/0129677 | A1 | * | 7/2004 | Portner et al. .................... 216/83 |
| 2004/0166785 | A1 | * | 8/2004 | Golzarian et al. .............. 451/56 |
| 2005/0183754 | A1 | * | 8/2005 | Kago et al. .................. 134/56 R |
| 2007/0026205 | A1 | * | 2/2007 | Anton et al. ............... 428/195.1 |

FOREIGN PATENT DOCUMENTS

| JP | 05228429 A | * | 9/1993 |
| JP | 8-236488 | | 9/1996 |
| JP | 2004-106084 | | 4/2004 |

* cited by examiner

*Primary Examiner* — Timothy H Meeks
*Assistant Examiner* — Lisha Jiang
(74) *Attorney, Agent, or Firm* — Oblon, Spivak, McClelland, Maier & Neustadt, L.L.P

(57) ABSTRACT

In the present invention, an insulating material is applied onto a substrate in a coating treatment unit to form a coating insulating film. The substrate is heated in the heating processing unit, whereby the coating insulating film is hardened partway. A brush is then pressed against the front surface of the coating insulating film in a planarization unit and moved along the front surface of the coating insulating film, thereby planarizing the coating insulating film. The substrate is then heated to completely harden the coating insulating film. According to the present invention, the coating film can be planarized without using the CMP technology.

15 Claims, 16 Drawing Sheets

SUBSTRATE PROCESSING METHOD AND PROGRAM

BACKGROUND OF THE INVENTION

1. Field of the Invention

The present invention relates to a substrate processing method and a program for causing a computer to execute the substrate processing method.

2. Description of the Related Art

In a process of forming, for example, a multilayer wiring structure of a semiconductor integrated circuit or the like, processing of forming an insulating film between metal wirings on a wafer is performed. For the processing of forming the insulating film, a coating method is widely used which applies a liquid insulating film material onto the wafer, rotates the wafer to diffuse the insulating film material over the wafer surface, and then hardens the insulating film material. The coating method is used to form an SOG (Spin On Glass) film or an SOD (Spin On Dielectric) film as the insulating film. With the coating method, a flat film can be easily formed as compared with the CVD (Chemical Vapor Deposition) method which is similarly widely known.

However, since the amount of the insulating film material entering the depressions varies due to the depth of steps and roughness of a base pattern even by the above-described coating method, projections and depressions may be formed on the front surface of the formed insulating film. Once the projections and depressions are formed on the front surface of the insulating film, focus is not partially achieved on the resist film at the upper layer at the time of exposure of the photolithography process, resulting in non-uniformity in the line width of the resist pattern and the etching width of the insulating film. Further, during the etching step, a situation occurs in which the depth of the etched trench differs between a portion with a large thickness and a portion with a small thickness of the insulating film. As a result, the metal wiring embedded in the trench in the insulating film differs in length and thickness, leading to non-uniformity in electric resistance of the wirings within the wafer. Thus, the formation of the projections and depressions on the front surface of the insulating film causes various troubles in the process of forming the multilayer wiring structure.

Hence, the CMP (Chemical Mechanical Polishing) processing to planarize the insulating film is performed after the insulating film is applied and hardened. The CMP processing is performed by bringing a polishing pad into contact with the wafer front surface while supplying a liquid slurry containing silica particles (a polishing liquid) to polish the wafer front surface in a CMP apparatus (Japanese Patent Application Laid-open No. 2004-106084).

However, the above-described CMP apparatus employs a polishing pad twice or larger than the wafer, and therefore is very large in size and also consumes a large amount of power. In addition, the apparatus uses a large amount of expensive slurry, leading to increased running cost. Furthermore, if the slurry remains on the wafer, it may contaminate or scratch the multilayer wiring. Therefore, a cleaning step performed by a cleaning unit for washing away the slurry is separately required, resulting in more complicated processing steps.

SUMMARY OF THE INVENTION

The present invention has been developed in consideration of the above points, and its object is to planarize a coating film such as an insulating film on a substrate such as a wafer without performing the above-described CMP processing.

The present invention to achieve the above object is a substrate processing method including: a coating step of applying a coating solution to the substrate to form a coating film; an intermediate hardening step of heating the substrate to harden the coating film partway; a planarization step of pressing a contact body against a front surface of the coating film hardened partway and moving the contact body along the front surface of the coating film to planarize the coating film; and thereafter, a hardening step of hardening the coating film.

According to the present invention, the coating film can be planarized before the coating film is hardened, and therefore it is unnecessary to performed the CMP processing as in the prior art. Accordingly, the coating film can be planarized at a low cost. Further, since no slurry is used, it is not necessary to perform a cleaning step of removing the slurry.

In the planarization step, a solvent for the coating solution may be supplied to the substrate. In this case, the contact body is moved along the front surface of the coating film with the substrate being rotated, and an amount of solvent supplied when the contact body is located at a peripheral portion of the substrate may be larger than the amount when the contact body is located at a central portion of the substrate.

In the planarization step, the contact body may be moved along the front surface of the coating film with the substrate being rotated, and the contact body may be moved from a central position of the substrate to a position at a peripheral portion where an edge portion of the substrate comes into contact with the contact body.

In the planarization step, the contact body may be moved along the front surface of the coating film with the substrate being rotated and the contact body may be reciprocated between a central portion and an end portion of the substrate, and when the planarization by the contact body is finished, the contact body may be moved to the outside of the substrate with the contact body kept pressed against the front surface of the coating film and the contact body may then be separated from the substrate.

The planarization step may include a cleaning step of cleaning the substrate front surface after planarization, and the cleaning step may discharge a solvent for the coating solution to a center of the substrate with the substrate being rotated, and then blow a nitrogen gas or an inert gas to the center of the substrate to remove a solution film at a central portion of the substrate.

In the intermediate hardening step, the coating film may be hardened so that the contact body is capable of trimming the coating film in the planarization step and the coating film never dissolves by the supply of the solvent.

The method may further include, between the planarization step and the hardening step, a coating film forming step of forming, on a flat surface formed in the planarization step, a coating film thinner than the coating film in the coating step, wherein the thin coating film may be removed by etching after the hardening step.

The substrate on which the thin coating film is formed may be heated.

In the planarization step, the coating film may be planarized such that a thin coating film is left on a finally formed target flat surface, and the thin coating film may be removed by etching after the hardening step.

The above-described substrate processing method may further include a heating step of heating the substrate for which the planarization step has been finished.

At least any one of a high-temperature heating step of heating the substrate at a temperature higher than the temperature in the heating step and an ultraviolet irradiation step of irradiating the substrate with ultraviolet rays may be performed after the heating step.

In the planarization step, the coating film may be planarized by the contact body in a sponge form.

The present invention according to another aspect is a program operating on a computer in a control unit for controlling a substrate processing apparatus to cause the substrate processing apparatus to perform the above-described substrate processing method.

According to the present invention, the coating film can be planarized without performing the CMP processing, resulting in reduced cost.

DETAILED DESCRIPTION OF THE INVENTION

Figure 1:
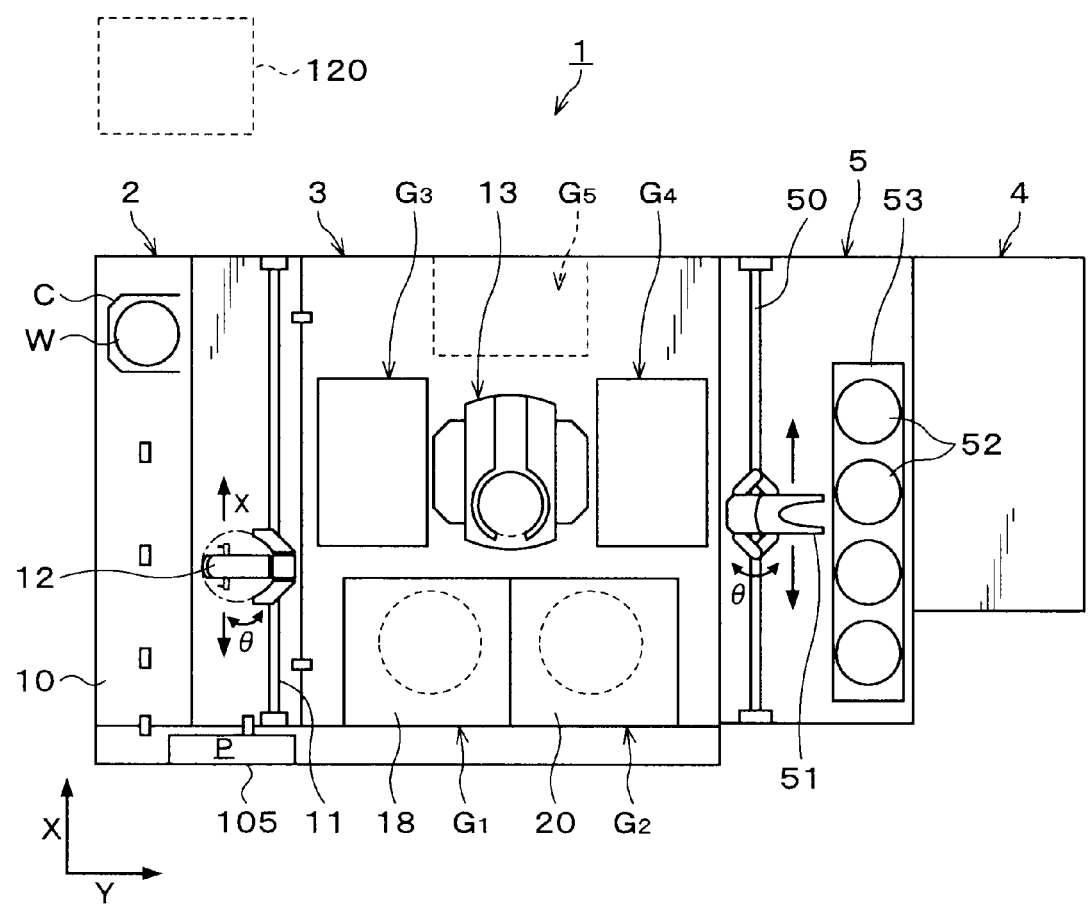
FIG. 1 is a plan view showing the outline of a configuration of a substrate processing system.
Figure 2:
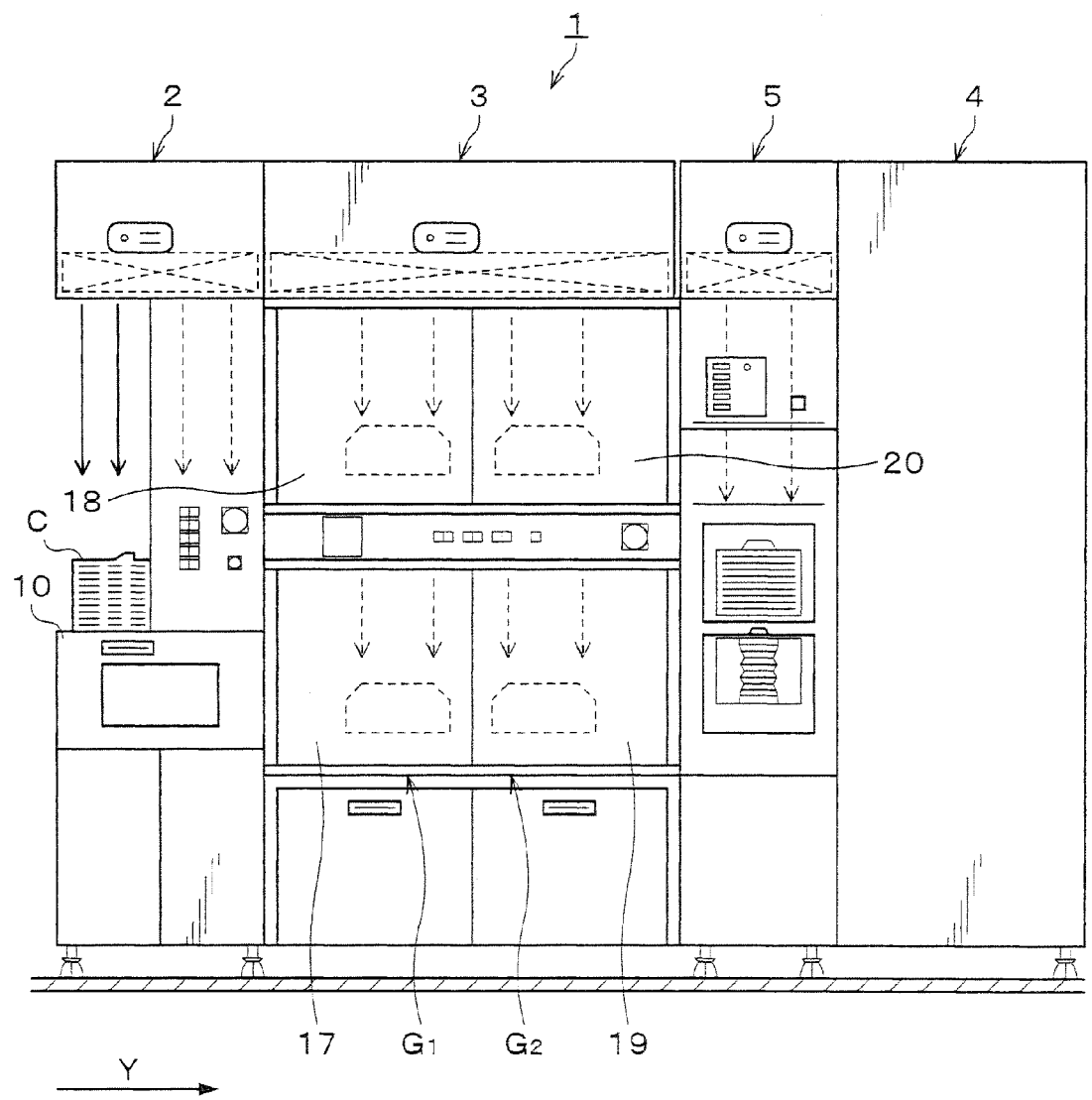
FIG. 2 is a front view of the substrate processing system 1 in FIG. 1.
Figure 3:
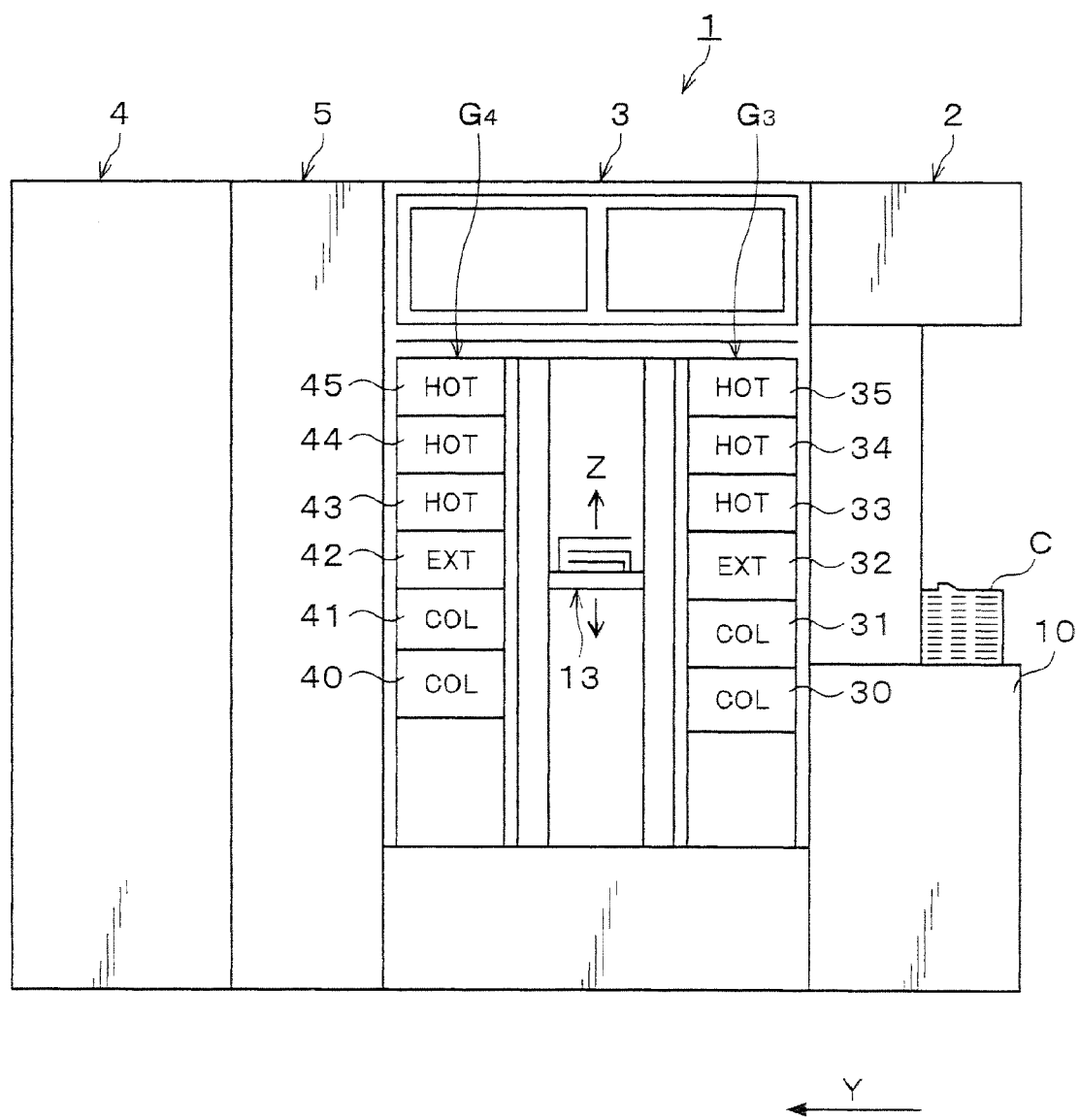
FIG. 3 is a rear view of the substrate processing system 1 in FIG. 1.

Hereinafter, preferred embodiments of the present invention will be described. FIG. 1 is a plan view showing the outline of a configuration of a substrate processing system 1 in which a substrate processing method according to the present embodiment is implemented, FIG. 2 is a front view of the substrate processing system 1, and FIG. 3 is a rear view of the substrate processing system 1.

The substrate processing system 1 has, as shown in FIG. 1, a configuration in which, for example, a cassette station 2 for transferring, for example, 25 wafers W per cassette as a unit from/to the outside into/from the substrate processing system 1 and transferring the wafers W into/out of a cassette C; a processing station 3 including a plurality of various kinds of processing and treatment units, which are multi-tiered, for performing predetermined processing or treatment in a manner of single wafer processing in a series of substrate processing; and an interface station 5 for passing the wafers W to/from a batch-type heating furnace 4 provided adjacent to the processing station 3, are integrally connected.

In the cassette station 2, a cassette mounting table 10 is provided and configured such that a plurality of cassettes C can be mounted on the cassette mounting table 10 in a line in an X-direction (a top-to-bottom direction in FIG. 1). In the cassette station 2, a wafer transfer body 12 is provided which is movable in the X-direction on a transfer path 11. The wafer transfer body 12 is also movable in a wafer-arrangement direction of the wafers W housed in the cassette C (a Z-direction; the vertical direction), and thus can selectively access the wafers W in each of the cassettes C arranged in the X-direction.

The wafer transfer body 12, which is rotatable in a θ-direction around the Z-axis, can access a later-described extension unit 32 included in a third processing unit group G3 on the processing station 3 side.

In the processing station 3, a main transfer unit 13 is provided at the central portion, and various kinds of processing and treatment units are multi-tiered to constitute processing unit groups around the main transfer unit 13. In the substrate processing system 1, four processing unit groups G1, G2, G3 and G4 are arranged. The first and second processing unit groups G1 and G2 are placed on the front side of the substrate processing system 1, the third processing unit group G3 is placed adjacent to the cassette station 2, and the fourth processing unit group G4 is placed adjacent to the interface station 5. Further, a fifth processing unit group G5 shown by a broken line can be separately placed on the rear side as an option. The main transfer unit 13 can transfer the wafer W to later-described various kinds of processing and treatment units arranged in these processing unit groups G1 to G5.

In the first processing unit group G1, for example, as shown in FIG. 2, a coating treatment unit 17 for applying an insulating material such as an SOG film material or an SOD film material to form a coating insulating film on the wafer W, and a planarization unit 18 for planarizing the coating insulating film are two-tiered in order from the bottom. In the second processing unit group G2, a coating treatment unit 19 and a planarization unit 20 are similarly two-tiered in order from the bottom. The coating treatment unit 19 includes, for example, a rotary mounting table for mounting and rotating the wafer thereon, such as a spin chuck in a treatment container and a nozzle for discharging the coating solution to the wafer.

In the third processing unit group G3, for example, as shown in FIG. 3, cooling processing units 30 and 31 each for cooling the wafer W, the extension unit 32 for keeping the wafer W waiting therein, heat processing units 33, 34 and 35 each for heat-processing the wafer W and the like are, for example, six-tiered in order from the bottom.

In the fourth processing unit group G4, for example, cooling processing units 40 and 41, an extension unit 42, and heat-processing units 43, 44 and 45 and the like are, for example, six-tiered in order from the bottom.

In the interface station 5, for example, as shown in FIG. 1, a wafer transfer body 51 is provided which moves on a transfer path 50 extending in the X-direction. Further, a mounting table 53, on which a plurality of wafer boats 52 can be placed side by side in the X-direction, is provided on the heating furnace 4 side in the interface station 5. The wafer boat 52 can hold a plurality of wafers W arranged at multiple tiers in the vertical direction. The wafer transfer body 51 is movable in the vertical direction and also rotatable in the θ-direction and thus can transfer the wafer W between the processing station 3 and the wafer boat 52 on the mounting table 53. The heating furnace 4 can house the wafer boat 52 from the interface station 5 and heat a plurality of wafers W at the same time.

Figure 4:
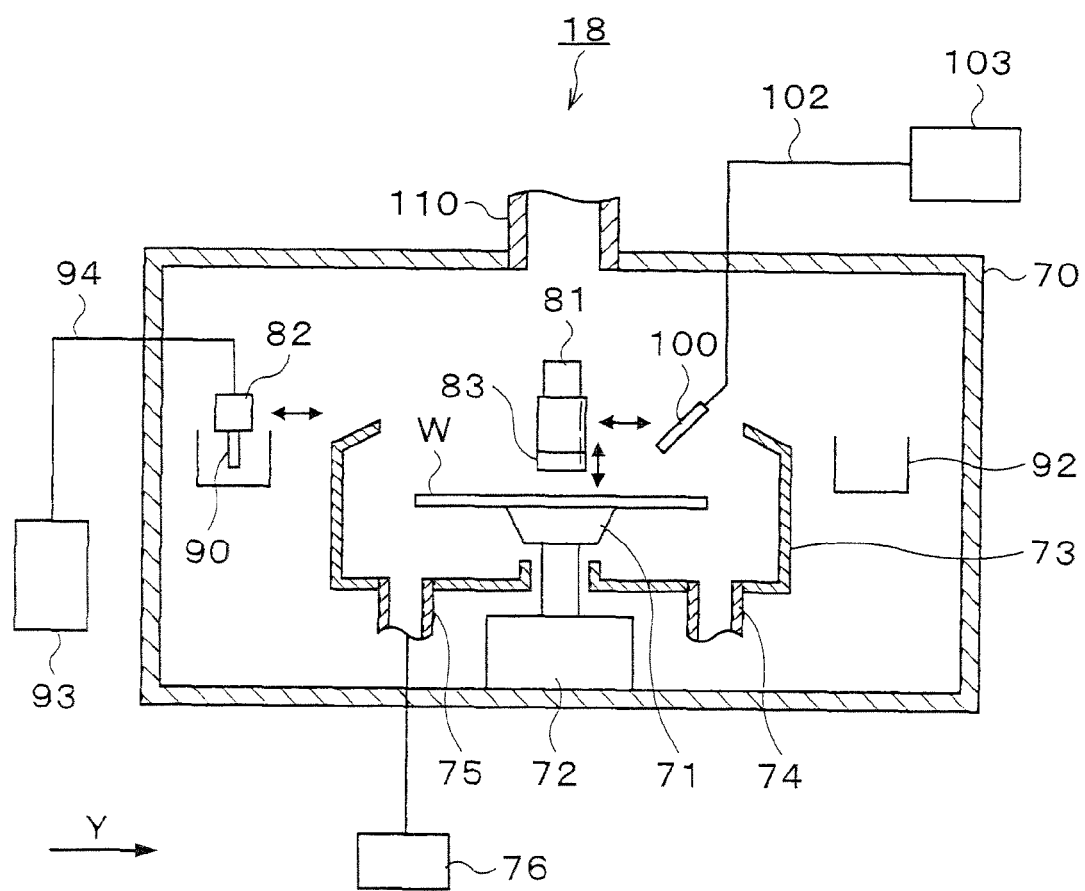
FIG. 4 is an explanatory view of a longitudinal section showing the outline of the configuration of a planarization unit.
Figure 5:
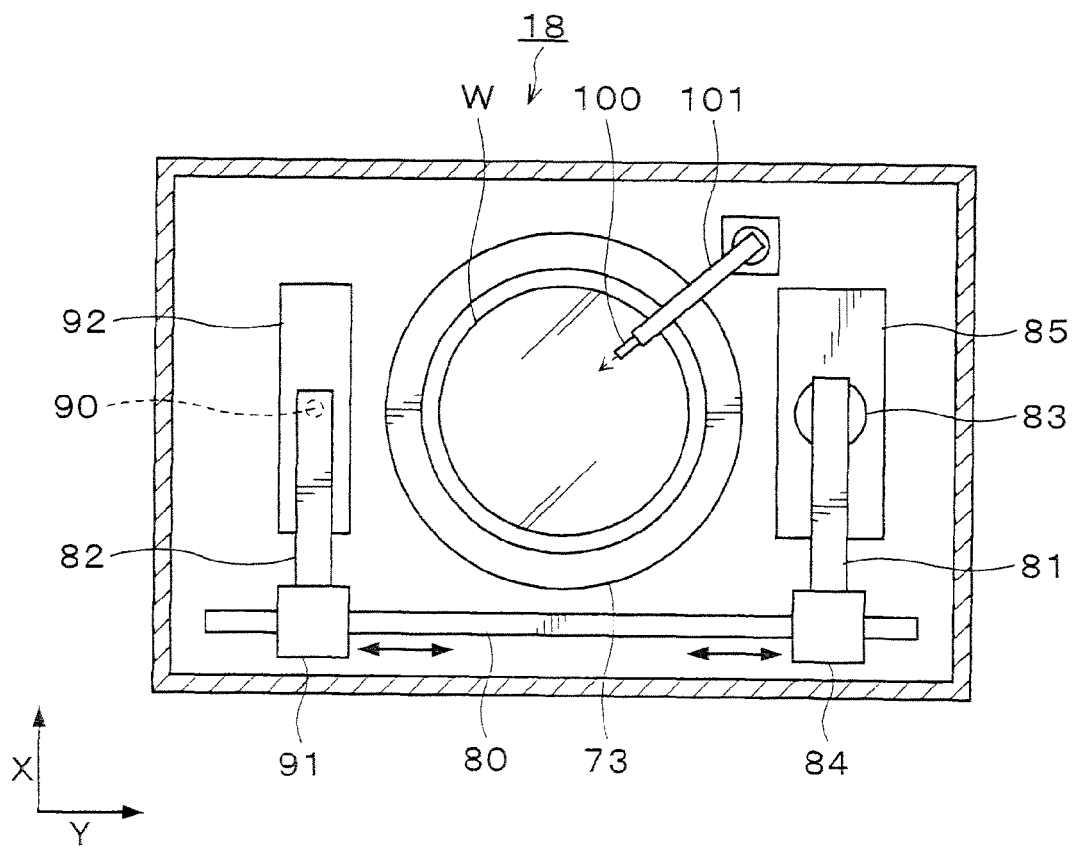
FIG. 5 is an explanatory view of a transverse section showing the outline of the configuration of the planarization unit.

Next, the configuration of the above-described planarization unit 18 and 20 will be described. FIG. 4 is an explanatory view of a longitudinal section showing the outline of the configuration of the planarization unit 18, and FIG. 5 is an explanatory view of a transverse section of the planarization unit 18.

The planarization unit 18 has, for example, a casing 70 capable of closing its inside. At the central portion of the casing 70, a spin chuck 71 is provided for holding and rotating the wafer W thereon. The spin chuck 71 has a horizontal upper surface which is provided with, for example, a suction port (not shown) for sucking the wafer W. Suction through the suction port allows the wafer W to be suction-held on the spin chuck 71.

The spin chuck 71 can be rotated at a predetermined speed, for example, by a chuck drive mechanism 72 including a motor or the like. The chuck drive mechanism 72 is provided with a raising and lowering drive source such as a cylinder so that the spin chuck 71 can be vertically moved.

Around the spin chuck 71, a cup is provided which receives the liquid scattering or dropping from the wafer W and collects it. To the bottom surface of the cup 73, a drain pipe 74 for draining the collected liquid and an exhaust pipe 75 for exhausting the atmosphere in the cup 73 are connected. The exhaust pipe 75 is connected to a negative pressure generator 76 such as a pump and thus can forcibly exhaust the atmosphere in the cup 73.

As shown in FIG. 5, a rail 80 extending along the Y-direction (the lateral direction in FIG. 5) is formed on the side of the negative direction in the X-direction (the downward direction in FIG. 5) of the cup 73. The rail 80 is formed from the outside on the negative direction side in the Y-direction (the left direction in FIG. 5) of the cup 73 to the outside on the positive direction side in the Y-direction (the right direction in FIG. 5). To the rail 80, for example, two arms 81 and 82 are attached.

Figure 6:
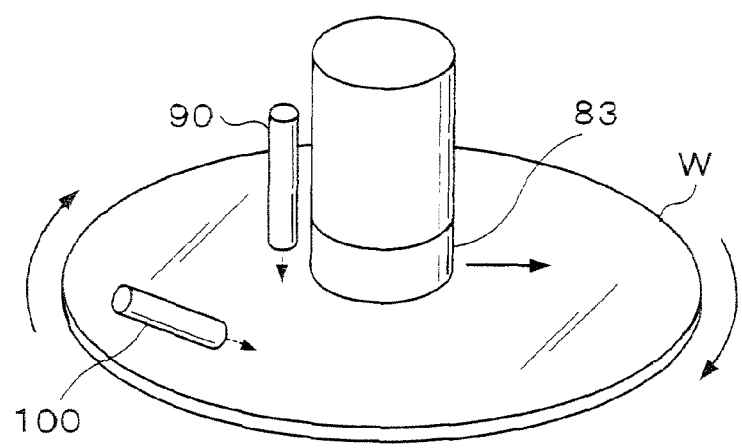
FIG. 6 is an explanatory view showing the appearance on a wafer during planarization processing.

On the first arm 81, a brush 83 as a contact body is supported. The brush 83, as shown in FIG. 6, is formed in an almost cylindrical form having a bottom surface formed flat. The brush 83 is made of, for example, urethane and formed in a flexible sponge form. The first arm 81 is movable on the rail 80 by means of a nozzle drive unit 84 shown in FIG. 5 and can move the brush 83 from a waiting portion 85 located outside the cup 73 on the positive direction side in the Y-direction into the cup 73 to thereby move it on the front surface of the wafer W in the horizontal direction. Further, the first arm 81 can freely rise and lower by means of the nozzle drive unit 84 and thus can raise and lower the brush 83 to press the brush 83 against the front surface of the wafer W at a predetermined pressure.

On the second arm 82, a solvent supply nozzle 90 is supported. The second arm 81 is movable on the rail 80, for example, by means of a nozzle drive unit 91 and can move the solvent supply nozzle 90 from a waiting portion 92 provided outside the cup 73 on the negative direction side in the Y-direction to a position above the wafer W in the cup 73. Further, the second arm 82 can freely rise and lower by means of the nozzle drive unit 91 and thus can also adjust the height of the solvent supply nozzle 90.

To the solvent supply nozzle 90, a supply pipe 94 is connected which communicates with a solvent supply source 93 as shown in FIG. 4. In the present embodiment, the solvent supply source 93 stores the solvent for the insulating material, for example, the solvent for the SOG film material such as, dibutyl ether (DBE), or the solvent for the SOD film material such as γ-butyrolactone or cyclohexanone.

A sub-nozzle 100 for discharging a solvent is provided above the spin chuck 71 in the cup 73. The sub-nozzle 100 is fixed by an arm 101, for example, as shown in FIG. 5, and is directed to a position off the center of the wafer W on the spin chuck 71, for example, near the middle of the radius of the wafer. The sub-nozzle 100 communicates with a solvent supply source 103 via a supply pipe 102 as shown in FIG. 4. The solvent supply source 103 stores the solvent for the insulating material that is the same as that in the above-described solvent supply source 93, for example, the solvent for the SOG film material or the solvent for the SOD film material. The central portion of the ceiling of the casing 70 is formed with an air supply port 110.

Note that the configuration of the planarization unit 20 is the same as that of the above-described planarization unit 18, and therefore the description thereof is omitted.

The control of the wafer processing in the substrate processing system 1 configured as described above is performed, for example, by a control unit 105 provided in the cassette station 2 as shown in FIG. 1. The control unit 105 is, for example, a computer including a program storage unit. The program storage unit stores a program P for controlling the operations of the above-described various kinds of processing and treatment units and the drive system such as transfer bodies to execute the wafer processing in a later-described predetermined recipe. Note that the program P is recorded on a computer-readable recording medium and may be installed into the control unit 105 from the recording medium.

Figure 7:
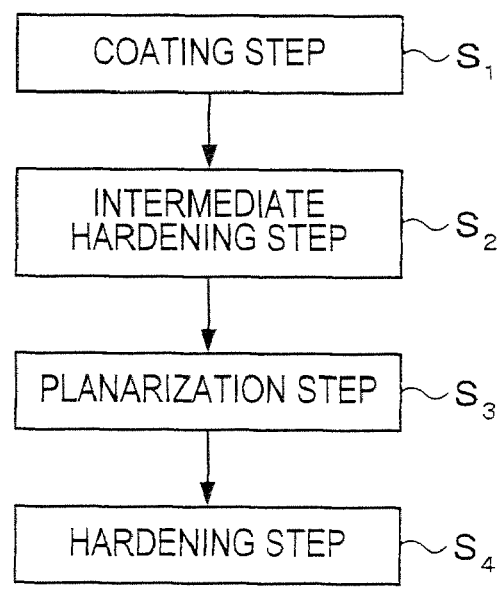
FIG. 7 is a flowchart of the wafer processing.

Next, the process of the wafer processing performed in the substrate processing system 1 configured as described above will be described. FIG. 7 shows a main processing flow of the wafer processing.

First of all, a wafer W is taken out of the cassette C on the cassette mounting table 10 by the wafer transfer body 12 and transferred to the cooling processing unit 30 via the extension unit 32 in the third processing unit group G3. The wafer W transferred to the cooling processing unit 30 is temperature-adjusted to a predetermined temperature and then transferred to the coating treatment unit 17 by the main transfer unit 13.

Figure 8:
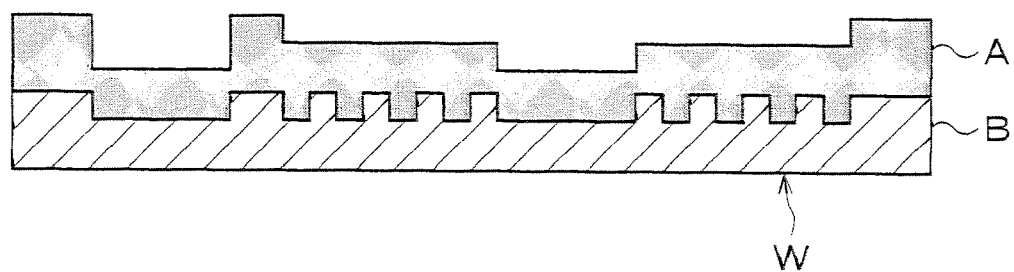
FIG. 8 is an explanatory view of a longitudinal section of the wafer showing the state in which a coating insulating film is formed on a base pattern.

In the coating treatment unit 17, the liquid insulating material is dripped, for example, to the central portion of the rotated wafer W, so that the insulating material is diffused to the entire front surface of the wafer W to form a coating insulating film on the front surface layer of the wafer W (a coating step S1 in FIG. 7). In this event, when microscopically viewing the front surface of the wafer W as shown in FIG. 8, the front surface of the coating insulating film A rises at portions where depressed portions of the projections and depressions of a base pattern B occupy a relatively small area, while the front surface lowers at portions where depressed portions of the base pattern B occupy a relatively large area. As described above, projections and depressions are formed on the front surface of the coating insulating film A, which correspond to the projections and depressions of the base pattern B.

The wafer W on which the coating insulating film A has been formed in the coating treatment unit 17 is transferred, for example, to the heat processing unit 33. In the heat processing unit 33, the wafer W is heated so that the coating insulating film A is hardened partway (an intermediate hardening step S2 in FIG. 7). In the intermediate hardening processing step, the coating insulating film A is hardened to an extent that the coating insulating film A can be trimmed by the brush 83 in a later-described subsequent planarization step and the coating insulating film A never dissolves even by supply of the solvent. For example, the wafer W is heated at a temperature of about 150° C. for about 100 to about 250 seconds. This heating evaporates a portion of the solvent so that the coating insulating film A is semidried.

The wafer W is then transferred to the cooling processing unit 31 and cooled there to a predetermined temperature, and is then transferred to the planarization unit 18.

Figure 9A:
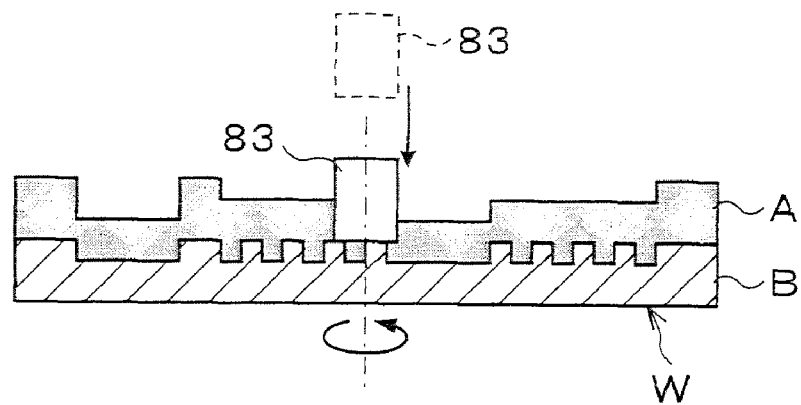
FIG. 9A is an explanatory view of a longitudinal section showing the state in which a brush is pressed against the center of the wafer.
Figure 9B:
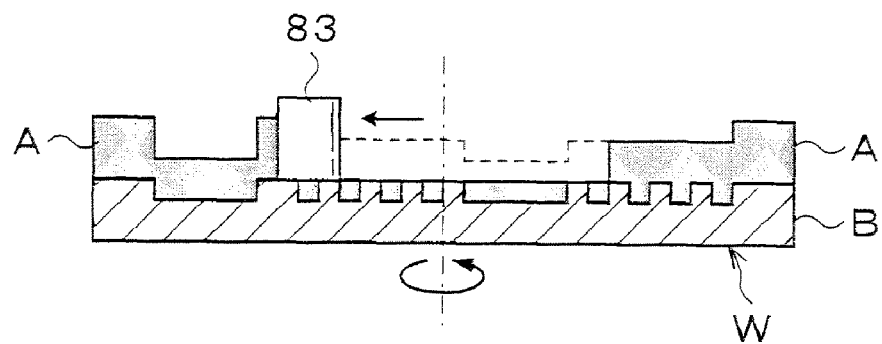
FIG. 9B is an explanatory view of a longitudinal section showing the state in which the brush is horizontally moved.
Figure 9C:
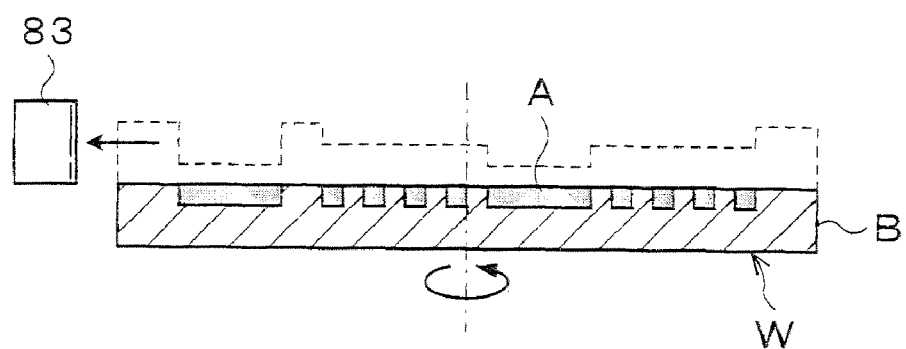
FIG. 9C is an explanatory view of a longitudinal section showing the state in which the brush reaches a position outside the wafer.

The wafer W transferred to the planarization unit 18 is first suction-held on the spin chuck 71 as shown in FIG. 4. Subsequently, the brush 83 and the solvent supply nozzle 90 are moved to positions above the center of the wafer W as shown in FIG. 6. Thereafter, the wafer W is rotated, and the solvent is discharged to a position near the center of the wafer W from the solvent supply nozzle 90. Further, the solvent is discharged from the sub-nozzle 100 to a position about the middle on the radius of the wafer W. In that state, the brush 83 is lowered and pressed against the coating insulating film A on the front surface layer of the wafer W at a predetermined pressure as shown in FIG. 9A. This trims the coating insulating film A down to a predetermined depth from its front surface. For example, when the insulating material is filled in the trenches of the base pattern B and the coating insulating film A projecting over from the trenches are removed as shown in FIG. 9B, the coating insulating film A is removed by the brush 83 down to a depth of the upper surface of the projections and depressions of the base pattern B. The brush 83 is then horizontally moved in a radial direction in the Y-direction of the wafer W to horizontally trim the coating insulating film A as shown in FIG. 9C. The brush 83 is then moved to the outside of the wafer W as shown in FIG. 9C, so that the coating insulating film A is planarized over the entire wafer front surface (a planarization step S3 in FIG. 7).

When the brush 83 reaches a position outside the wafer W, the brush 83 retracts from the position above the wafer W. With the rotation of the wafer W kept, for example, the solvent supply nozzle 90 is moved from the position above the center of the wafer W to the outside while discharging the solvent, whereby cleaning of the wafer W is performed for a fixed time, for example, 30 seconds. The discharge of the solvent is then stopped, and shake-off drying by rotation is performed for the wafer W. The rotation of the wafer W is then stopped, with an end of a series of planarization processing.

The wafer W for which the planarization processing has been finished is transferred from the planarization unit 18, for example, to the extension unit 42, and transferred from the extension unit 42 to the interface station 5. The wafer W is then housed in the wafer boat 52, and at the time when a predetermined number of wafers W are housed in the wafer boat 52, the wafers W are transferred to the heating furnace 4 on a wafer boat 52 basis. In the heating furnace 4, the wafer W is heated in an atmosphere at a high temperature and a high humidity and, for example, at 400° C. or higher so that the coating insulating film A is hardened (a hardening step S4 in FIG. 7). Note that, for the SOG film, a combination reaction of the SOG film is performed in this hardening step.

The wafer W for which the hardening processing has been finished is returned to the processing station 3, for example, via the interface station 5 and returned from the processing station 3 to the cassette station 2, and then returned by the wafer transfer body 12 into the cassette C.

According to the above-described embodiment, the coating insulating film A is formed on the wafer W, the coating insulating film A is then hardened partway, and thereafter the brush 83 is pressed against the coating insulating film A and moved along the front surface of the wafer to thereby planarize the coating insulating film A. After the coating insulating film A is planarized, the wafer W is heated at a high temperature to harden the coating insulating film A. As described above, since the coating insulating film A is planarized during the time when the coating insulating film A is in a soft state before it is hardened, the coating insulating film A can be appropriately planarized without performing the CMP processing after the hardening as in the prior art. As a result of this, a series of processing to planarize the coating insulating film A can be performed at a low cost. Further, a large-scale CMP apparatus becomes unnecessary to reduce the space accordingly. In addition, since no slurry is used, any cleaning step by a cleaning apparatus for sweeping away the slurry is not necessary.

Since the brush 83 is used to planarize the coating insulating film A while the solvent is being supplied to the wafer W in the planarization step, the residue of the coating insulating film A can be washed away while the frictional heat generated between the coating insulating film A and the brush 83 is being removed.

Since the coating insulating film A is hardened to an appropriate hardness in the intermediate hardening step, the brush 83 can be used to appropriately trim the coating insulating film A in the planarization step as well as the coating insulating film A never dissolves even when the solvent is supplied thereto.

Figure 10:
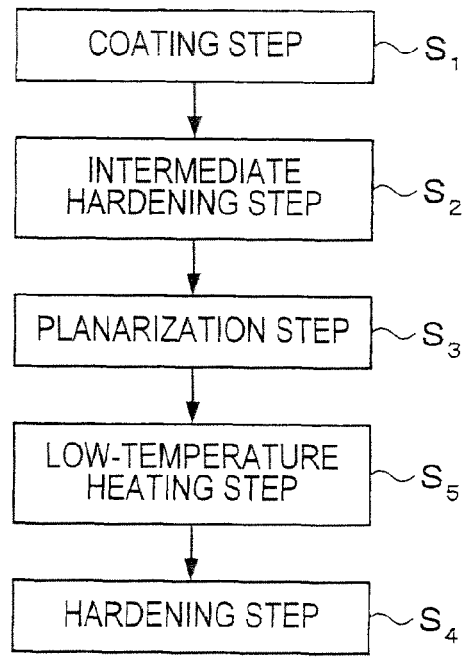
FIG. 10 is a flowchart of the wafer processing including a low-temperature heating step.

While the wafer W for which the planarization processing has been finished is directly transferred to the heating furnace 4 and subjected to the hardening processing in the above-described embodiment, the wafer W may be heated at a low temperature after the planarization step S3 and before the hardening step S4 as shown in FIG. 10 (a low-temperature heating step S5). In this case, the wafer W for which the planarization processing has been finished in the planarization unit 18 is transferred, for example, to the heating processing unit 43 and heated there. The heating temperature in this event is set to a temperature lower than the temperature of the hardening processing, for example, to about 150° C. This heating evaporates and removes the solvent which has been supplied to the wafer W during the planarization processing. The wafer W is then transferred, for example, to the cooling processing unit 41 and temporarily cooled there, and then transferred, for example, to the heating furnace 4 and subjected to hardening processing there.

Figure 11:
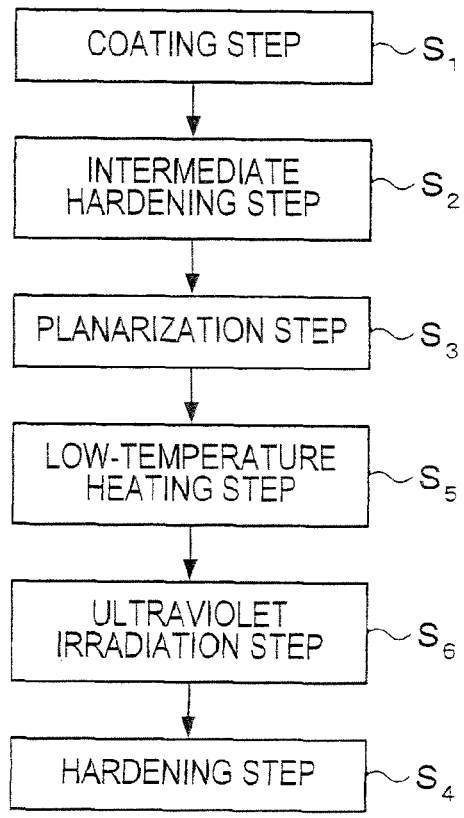
FIG. 11 is a flowchart of the wafer processing including an ultraviolet irradiation step.
Figure 12:
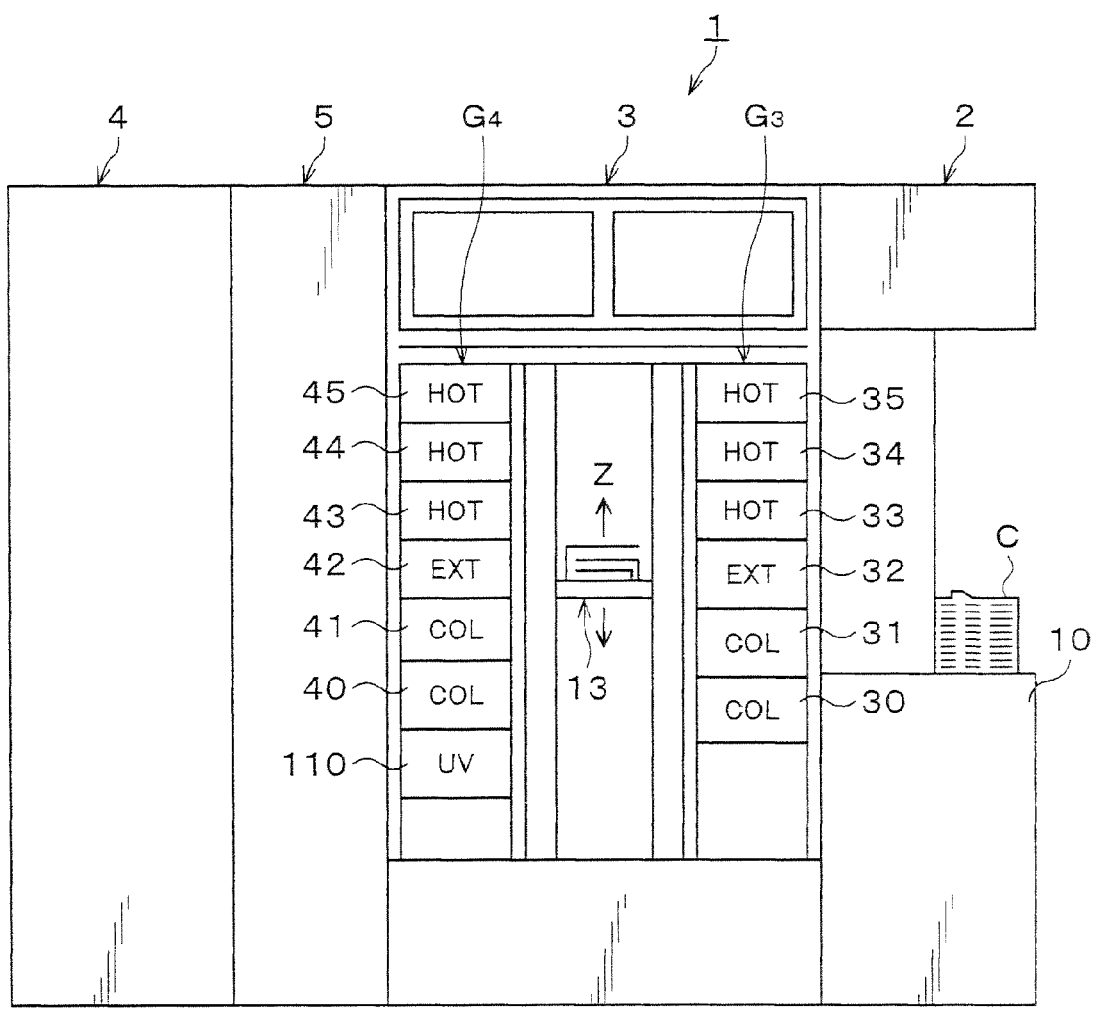
FIG. 12 is a rear view of the substrate processing system including a UV irradiation unit.

Further, between the low-temperature heating step S5 and the hardening step S4, the wafer W may be irradiated with ultraviolet rays (an ultraviolet irradiation step S6) as shown in FIG. 11. In this case, a UV irradiation unit 110 is provided in the fourth processing unit group G4 in the processing station 3 as shown in FIG. 12. The UV irradiation unit 110 includes, for example, a mounting table for mounting the wafer thereon and an ultraviolet lamp for irradiating the wafer on the mounting table with ultraviolet rays. The wafer W for which the planarization processing has been finished is transferred to the UV irradiation unit 110 where the front surface of the wafer W is irradiated with ultraviolet rays. The irradiation with ultraviolet rays removes an organic matter adhering to the front surface due to the contact with the brush 83 during the planarization processing. The wafer W is then transferred to any one of the cooling processing units in the processing station 3 and temperature-adjusted there, and transferred to the heating furnace 4 and subjected to hardening processing there. According to this example, mixture of impurities into the multilayer wiring structure of the wafer W is prevented.

Figure 13:
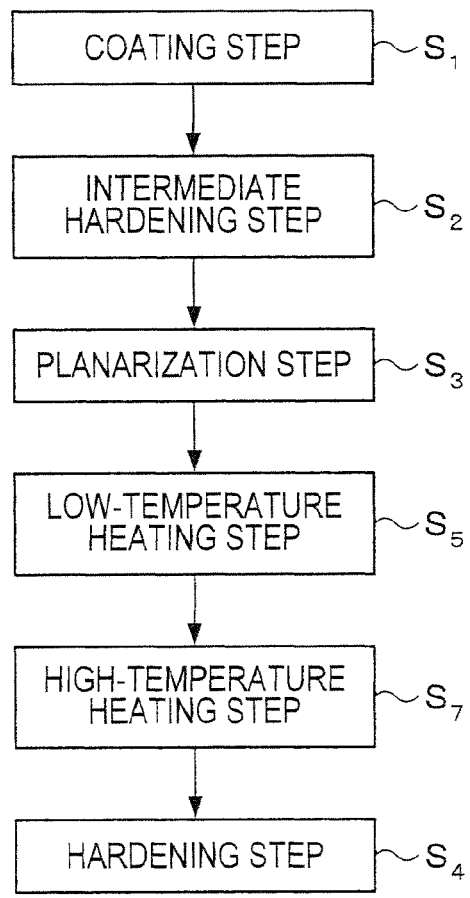
FIG. 13 is a flowchart of the wafer processing including a high-temperature heating step.

It should be noted that, in the above-described example, the wafer W may be heated at a high temperature (a high-temperature heating step S7) as shown in FIG. 13 in place of the ultraviolet irradiation step S6. In this case, the wafer W for which the planarization processing has been finished is transferred to any one of the heating processing units in the processing station 3 and heated there. The heating temperature in this event is set to a temperature higher than that in the above-described low-temperature heating, to about 350° C. The wafer W after the heating is cooled in the cooling processing unit. This can also remove the organic film adhering to the front surface of the wafer.

Figure 14:
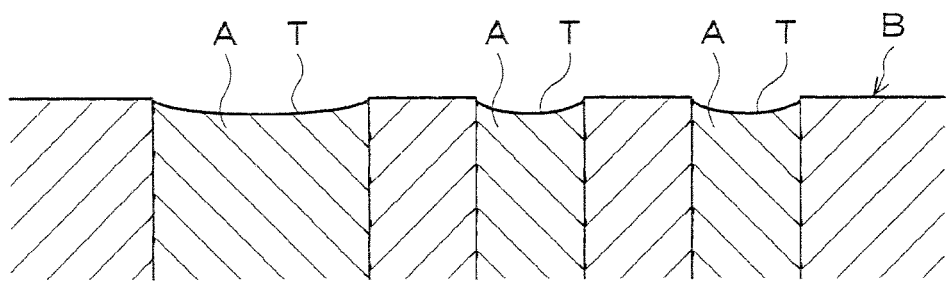
FIG. 14 is an explanatory view of a longitudinal section of the wafer showing the state of projections and depressions on the front surface of the coating insulating film.
Figure 15A:
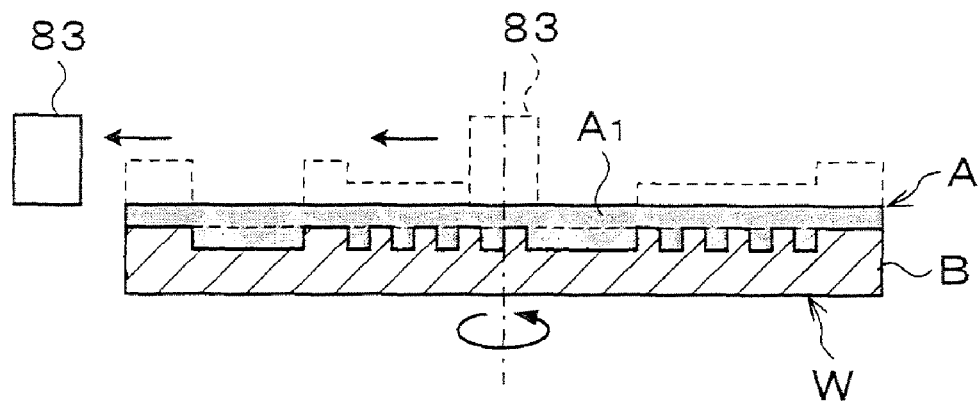
FIG. 15A is an explanatory view of a longitudinal section of the wafer showing the state in which planarization is performed with a thin coating insulating film being left.
Figure 15B:
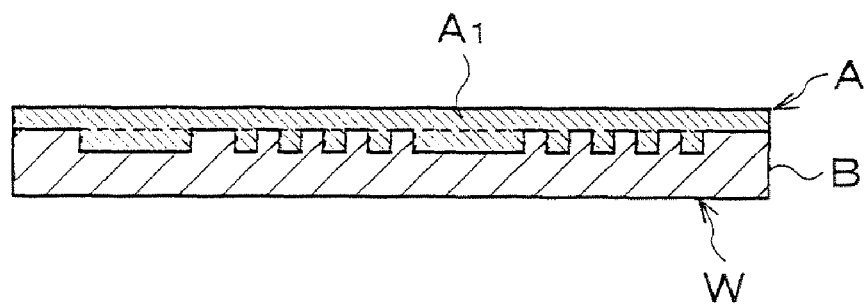
FIG. 15B is an explanatory view of a longitudinal section of the wafer showing the state in which the coating insulating film is hardened.
Figure 15C:
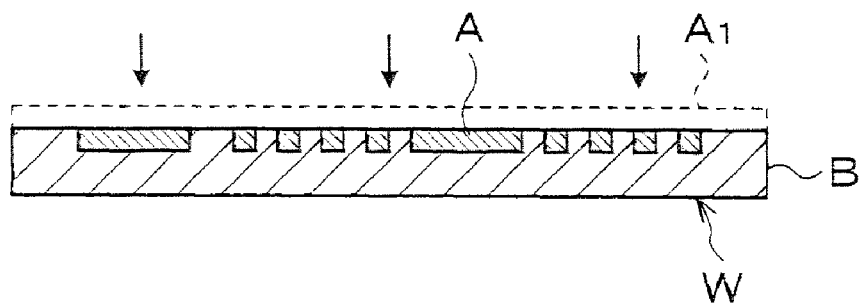
FIG. 15C is an explanatory view of a longitudinal section of the wafer showing the state in which the thin coating insulating film is etched.

Incidentally, in the case where the coating insulating film A is removed by the brush 83 as in the above-described embodiment, small projections and depressions corresponding to the projections and depressions of the base pattern may remain on the front surface of the coating insulating film A due to the surface roughness and hardness of the brush 83. Further, the coating insulating film A may shrink to leave small projections and depressions on the front surface of the coating insulating film A because of the hardening processing after the planarization processing. In this case, the upper surface of the coating insulating film A in trenches T of the base pattern B recesses convexly downward, for example, as shown in FIG. 14. To improve this state, for example, the coating insulating film A may be trimmed in a manner to leave a thin coating insulating film on a final target flat surface in advance during the planarization processing. In this case, for example, by conducting control of the pressure to press the brush 83 against the coating insulating film A or positional control of the brush 83 in the vertical direction to vary the depth of trimming the coating insulating film A, a thin coating insulating film A1 is left on the upper surface of the base pattern B as shown in FIG. 15A. This thin coating insulating film A1 is set to have a thickness, for example, of about 100 nm to about 500 nm. The hardening processing is then performed in the presence of the thin coating insulating film A1, whereby the entire coating insulating film A is hardened as shown in FIG. 15B. The wafer W is then transferred to an etching unit 120 (shown by a dotted line in FIG. 1) where the thin coating insulating film A1 is isotropically etched and removed in the film thickness direction as shown in FIG. 15C. According to this example, leaving the thin coating insulating film A1 can suppress the influence of the brush 83 during the planarization and the influence of shrinkage during the hardening, resulting in improved flatness of the finally formed coating insulating film A.

Figure 16:
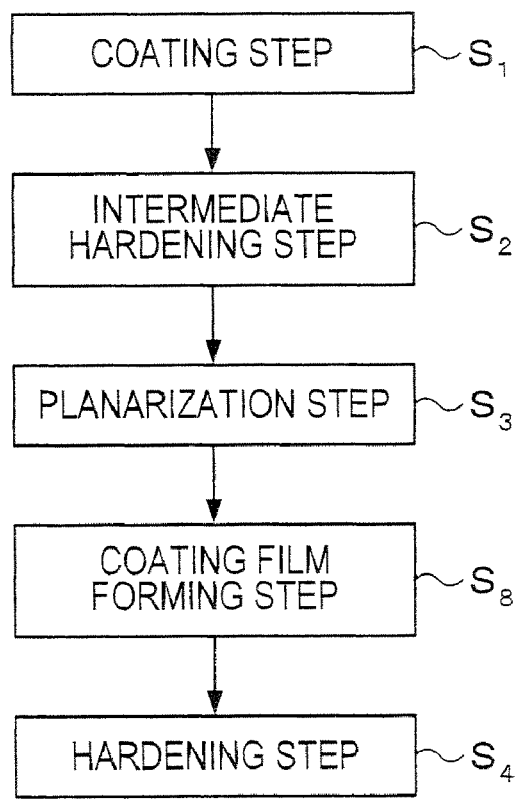
FIG. 16 is a flowchart of the wafer processing including a coating film forming step.
Figure 17:
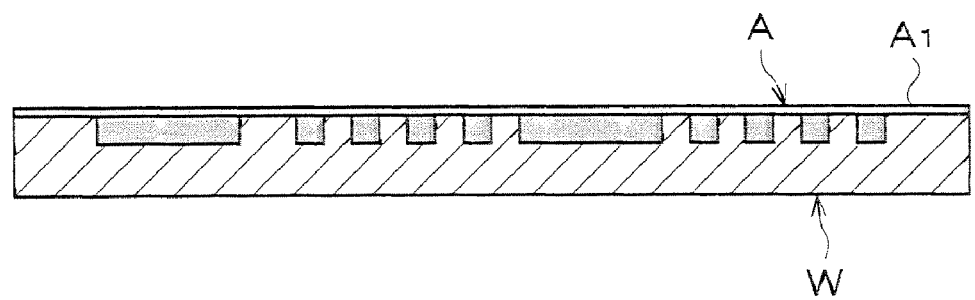
FIG. 17 is an explanatory view of a longitudinal section of the wafer showing the state in which the thin coating insulating film is formed.

While the planarization processing is performed to leave the thin coating insulating film A1 on the target flat surface in the previously described embodiment, the coating insulating film A may be temporarily trimmed down to the target flat surface by the planarization processing as in the above-described embodiment, and thereafter the coating treatment may be performed again to form the thin coating insulating film A1 (a coating film forming step S8 shown in FIG. 16). In this case, for example, the wafer W for which the planarization processing has been finished is transferred again to the coating treatment unit 18 where the thin coating insulating film A1 is applied on the wafer W as shown in FIG. 17. The wafer W on which the thin coating insulating film A1 has been formed is transferred to the heating processing unit and heated and dried there. The wafer W is then cooled in the cooling processing unit, and then transferred to the heating furnace 4 and subjected to hardening processing there. Also in this case, a flatter coating insulating film A can be finally formed.

Note that the coating film forming step S8 being the second coating step is performed after the above-described low-temperature heating step S5, ultraviolet irradiation step S6, or high-temperature heating step S7 if the coating film forming step S8 is performed in combination with those steps.

An example of the multilayer wiring structure to which the process of the wafer processing described in the above embodiments is applied will be described here.

Figure 18:
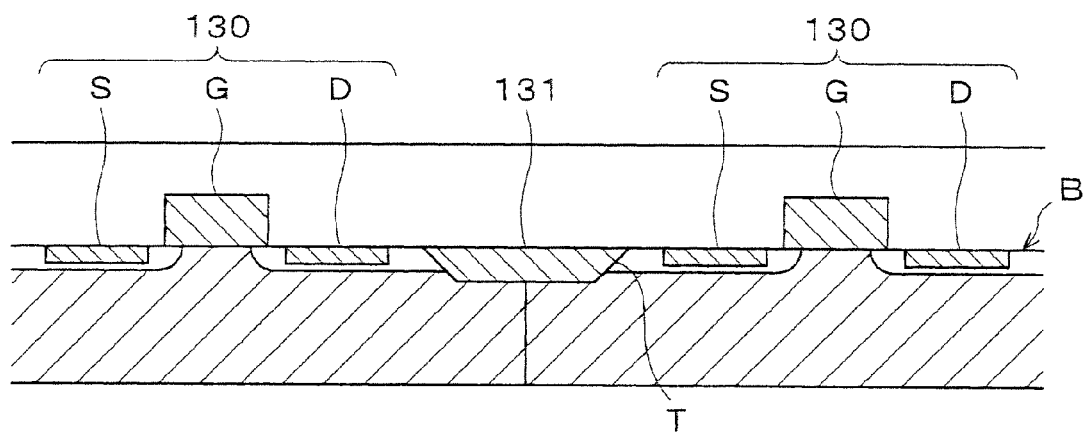
FIG. 18 is an explanatory view of a longitudinal section showing a multilayer wiring structure in which an element isolation trench is formed in the base pattern.

The above-described process of the wafer processing, for example, may be employed in forming an element isolation (STI: Shallow Trench Isolation) film 131 as a coating insulating film between adjacent transistors 130 and 130 as shown in FIG. 18. In this case, an element isolation trench T is formed in the base pattern B, and the SOG film which will form the element isolation film 131 is formed on the base pattern B. In this case, the upper surfaces of the sources S and the drains D of the transistors 130 are never scrubbed with the slurry for the CMP processing at the time of forming the element isolation film 131, so that degradation of the transistors 130 can be prevented. Further, since the flat SOG film can be formed which has an upper surface flush with the upper surfaces of the sources S and the drains D, thereby forming the element isolation film 131 with an extremely high insulation property. Note that a symbol G in FIG. 18 represents a gate electrode.

Figure 19:
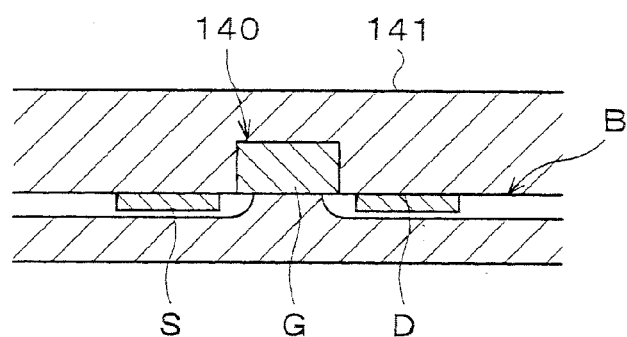
FIG. 19 is an explanatory view of a longitudinal section showing the multilayer wiring structure in which a transistor is formed on the base pattern.

Further, the above-described process of the wafer processing may be employed in forming an insulating film on an electronic element. In this case, for example, a transistor 140 being the electronic element is formed on the base pattern B, for example, as shown in FIG. 19, and an SOD film 141 which will be the coating insulating film is formed on the base pattern B. In this case, since a strong stress is never exerted on the transistor 140 on the base unlike the case of the CMP processing, for example, degradation and breakage of the transistor 140 can be prevented.

Figure 20:
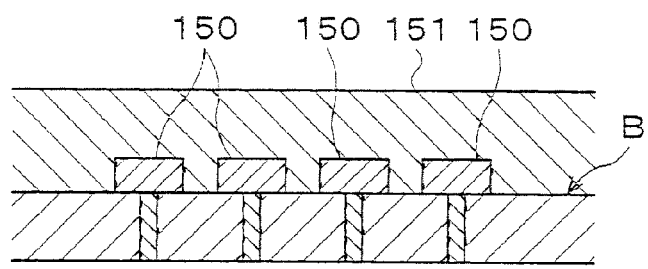
FIG. 20 is an explanatory view of a longitudinal section showing the multilayer wiring structure in which aluminum wirings are formed on the base pattern.

Furthermore, the above-described process of the wafer processing may be employed in forming an interlayer insulating film on a metal wiring. In this case, for example, aluminum wirings 150 being the metal wirings are formed on the base pattern B, for example, as shown in FIG. 20, and an SOD film 151 which will be the interlayer insulating film is formed on the base pattern B. Also in this case, no load is exerted on the aluminum wirings 150, so that wiring breakage and defective contact can be prevented.

Figure 21:
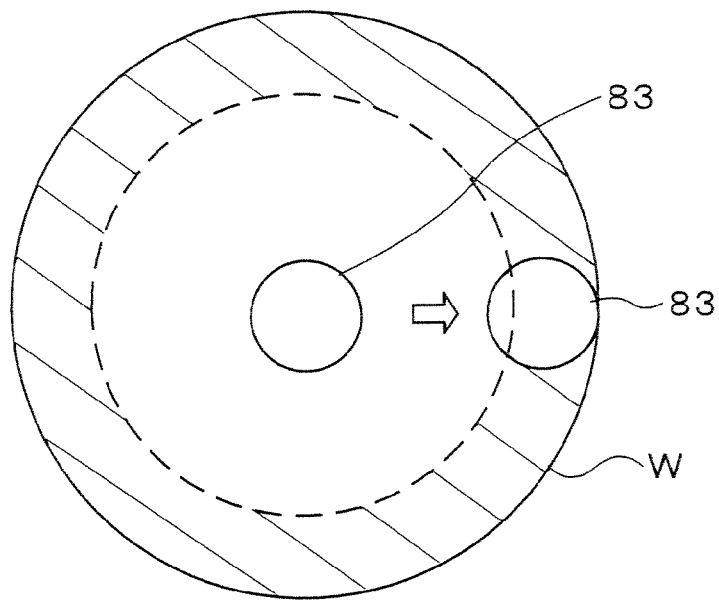
FIG. 21 is a plan view of the wafer for explaining control of solvent supply in the planarization step.
Figure 22:
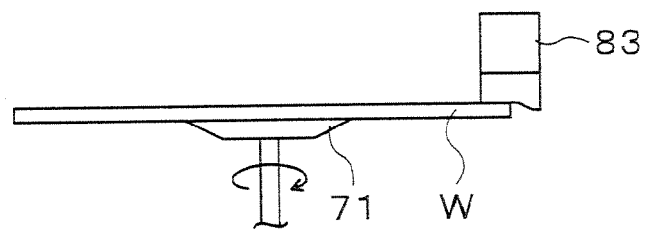
FIG. 22 is a side view showing the state in which the brush is moved to the end portion of the wafer.

For planarization of the front surface of the wafer W in the planarization unit 18 by moving the brush 83 from the center of the wafer W to the end portion of the wafer W, it is preferable to vary the amount of the solvent supplied to the wafer W during the planarization. In other words, in comparison of the case in which the brush 83 is located near the center of the wafer W with the case in which the brush 83 is located at the end portion of the wafer W, the amount of solvent supplied per unit area is smaller at the end portion of the wafer W than that at the center of the wafer W. This may cause difference in planarization between the end portion and the center of the wafer W during the planarization processing when the brush 83 is pressed against the wafer W. Accordingly, it is preferable to increase the amount of solvent supplied, by controlling it with movement of the brush 83 from the center of the wafer W to the end portion of the wafer W. From knowledge of the inventors, it is preferable to supply, to the region extending between the end portion of the wafer W and a one-third of the radius from the end portion toward the center of the wafer W (the region shown by diagonal lines in the drawing) as shown in FIG. 21, the solvent about twice in amount that supplied to the other region (the region on the center side). This further improves uniformity in processing.

When moving the brush 83 to the end portion of the wafer W in the planarization step, it is preferable to move the brush 83 to a position at a peripheral portion where the edge portion of the wafer W comes into contact with the brush 83. This can remove particles and other contaminants existing on the edge portion of the wafer W.

Figure 23:
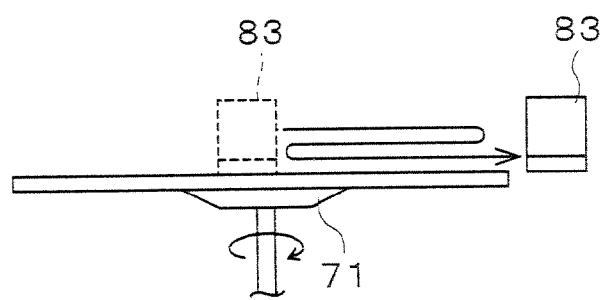
FIG. 23 is a side view showing the state in which the brush is separated from the wafer after the brush is reciprocated between the center and the end portion of the wafer.

When moving the brush 83 pressed against the front surface of the coating film on the wafer W while the wafer W is being rotated, the brush 83 may be reciprocated between the central portion and the end portion of the wafer W as shown in FIG. 23. At the time when finishing the planarization processing, it is preferable to move the brush 83 kept pressed against the front surface of the wafer W to a position outside the wafer W and then separate the brush 83 from the wafer W. Separation of the brush 83 from the wafer W as in the above-described manner can expel the residue of the coating film trimmed during the planarization to the outside of the wafer W as it is, thus preventing the residue from being left on the wafer W. If the brush 83 is raised near the center of the wafer W to separate from the wafer W, the residue of the coating film is left on the wafer W as it is.

Figure 24:
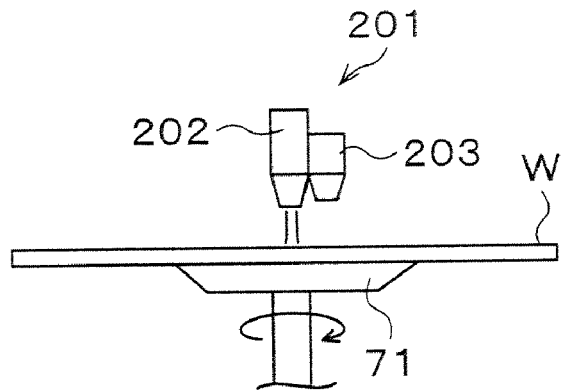
FIG. 24 is a side view showing the state of solvent discharge by a combined nozzle.

As previously described, after the planarization, the solvent supply nozzle 90 is moved from the position above the center of the wafer W to the outside while discharging the solvent with the wafer W being rotated, and in this case, a combined nozzle 201 shown in FIG. 24 may be used to perform a cleaning treatment accompanied with supply of an inert gas.

Figure 25:
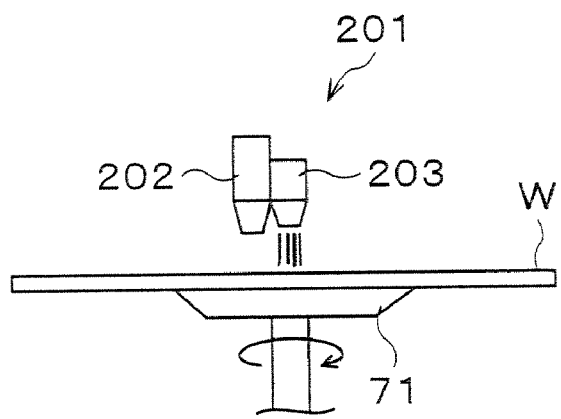
FIG. 25 is a side view showing the state of blow of a nitrogen gas by the combined nozzle.

The combined nozzle 201 has a structure in which a solvent supply nozzle 202 and a blowing nozzle 203 for an inert gas, for example, a nitrogen gas are arranged side by side. As shown in FIG. 24, the solvent supply nozzle 202 is first located at a position above the center of the wafer W with the wafer W being rotated, and discharges the solvent toward the wafer W. The blowing nozzle 203 is then located at a position above the center of the wafer W and blows the nitrogen gas toward the wafer W as shown in FIG. 25.

Figure 26:
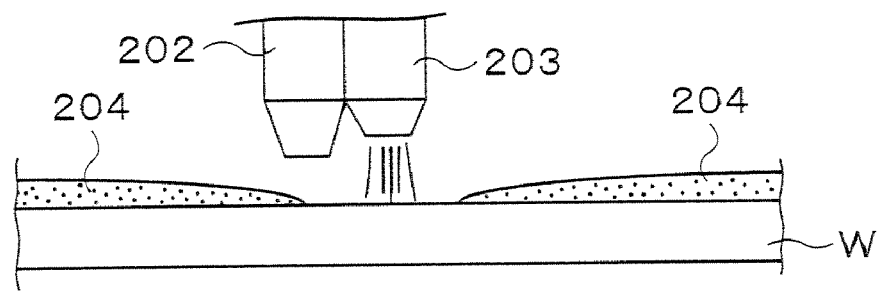
FIG. 26 is a side view showing the appearance in which a solution film at the center of the wafer is removed by the nitrogen gas.

This completely removes a solution film 204 of the solvent at the center of the wafer W by the blown nitrogen gas as shown in FIG. 26, thus allowing subsequent spin-drying to be preferably performed. In the case in which the spin-drying is performed by rotating the wafer W, the solution film at the center of the wafer W cannot be completely shaken off sometimes. The processing accompanied with the supply of the inert gas as described above can be employed to completely remove the solution film on the wafer W including the central portion so as to realize preferable cleaning and drying processing.

Figure 27:
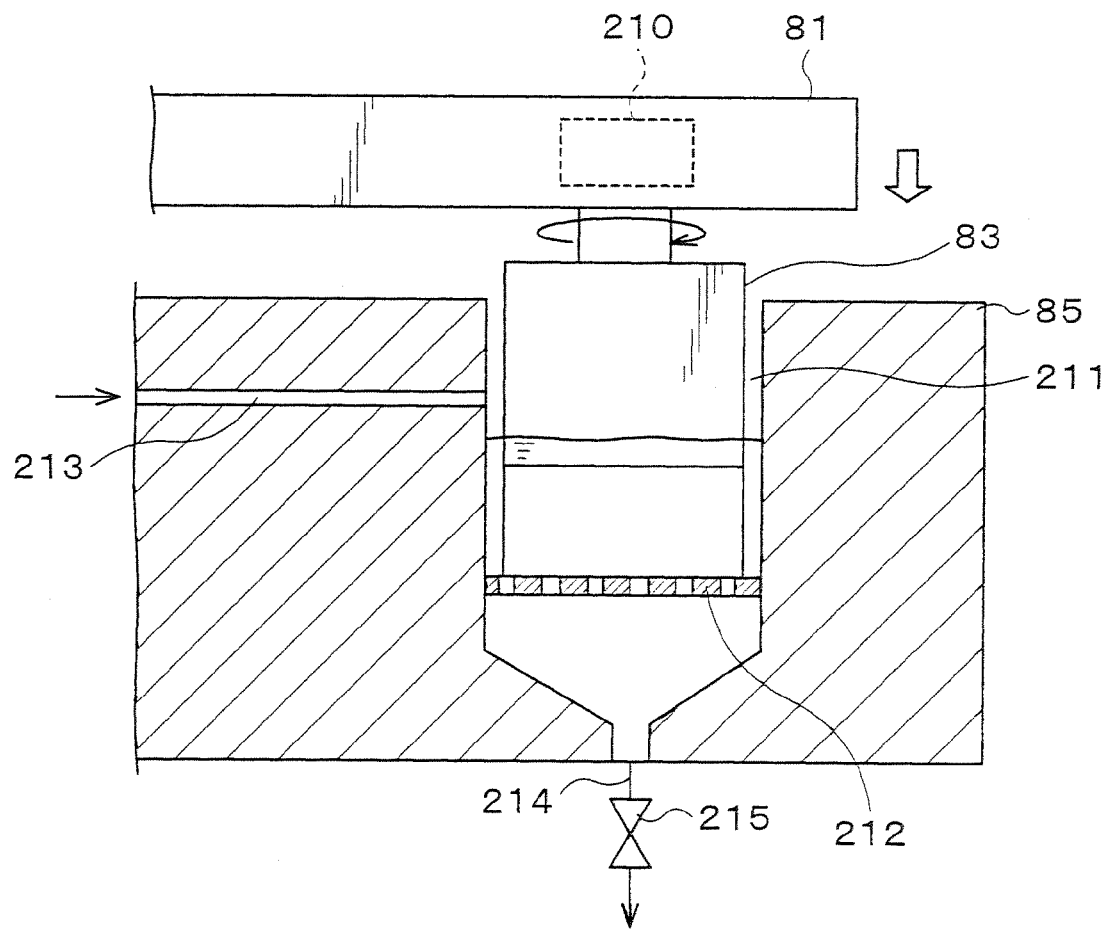
FIG. 27 is a side sectional view showing the appearance in which the brush is cleaned in a cleaning bath provided at a waiting portion.

As shown in FIG. 27, the brush 83 may be rotationally driven, for example, by a motor 210 provided in the first arm 81.

Where the brush 83 is configured to be rotatable as described above, the lower face that is a contact face of the brush 83 can be effectively cleaned during the time when the brush 83 is waiting at the waiting portion 85. FIG. 27 shows an example of a specific configuration of the above case, in which a cleaning bath 211 into which the brush 83 is inserted is formed at the waiting portion 85. At a lower portion of the cleaning bath 211, a cleaning plate 212 formed with many holes is horizontally provided, which is made, for example, of a mesh or a porous plate. To the cleaning bath 211, a cleaning solution, for example, a solvent is supplied via a supply path 213. To the bottom portion of the cleaning bath 211, a drain path 214 is connected, and it is opened/closed by a valve 215.

According to the example shown in FIG. 27, the lower face that is the contact face of the brush 83 can be effectively cleaned by pressing the brush 83 against the cleaning plate 212 and rotating the brush 83. This can refresh the contact face of the brush 83 during the time when the brush 83 is waiting at the waiting potion 85. Accordingly, the planarization processing can be performed with the contact face of the brush 83 kept in a preferable state, for example, in a state in which appropriate projections and depressions existing on the lower face.

Figure 28:
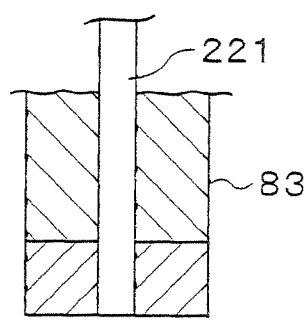
FIG. 28 is a sectional view of the brush having a solvent supply path at its center.

It should be noted that, as previously described, the solvent is supplied to the position near the center of the wafer W by the solvent supply nozzle 90 in the planarization step, but the solvent may be supplied to the center of the wafer W. In this case, a solvent supply path 221 for supplying the solvent to the center of the brush 83 is provided in the brush 83 as shown in FIG. 28, thus allowing the solvent to be supplied to the center of the wafer W during the planarization processing.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The above embodiments are directed, for example, to formation and planarization of the insulating film, but the present invention is also applicable to the case in which a coating film other than the insulating film is formed and planarized. Further, the present invention is also applicable to the wafer processing to form a multilayer wiring structure other than the above-described multilayer wiring structure. Further, the coating method in the coating step in the present invention is not limited to the spin coating method of coating the wafer with the wafer being rotated, but may be a scan coating method of applying the coating solution with the nozzle discharging the coating solution and the wafer being relatively moved. Besides, the present invention is also applicable to the processing for a substrate other than the wafer, such as an FPD (Flat Panel Display), a mask reticle for a photomask, and the like.

The present invention is useful in planarizing the coating film without using the CMP technology.

What is claimed is:

1. A substrate processing method of performing processing for a substrate, comprising:
    a first coating step of applying a coating solution to the substrate to form a coating film;
    an intermediate hardening step of heating the substrate to harden the coating film partway;
    a planarization step of pressing a contact body against a front surface of the coating film hardened partway and moving the contact body along the front surface of the coating film to planarize the coating film;
    a second coating film forming step of forming, on a flat surface formed in said planarization step, a coating film thinner than the coating film in said first coating step; and
    thereafter, a final hardening step of hardening the coating films,
    wherein the thin coating film is removed by etching after said final hardening step.

2. The substrate processing method as set forth in claim 1, wherein in said planarization step, a solvent for the coating solution is supplied to the substrate.

3. The substrate processing method as set forth in claim 2, wherein in said planarization step, the contact body is moved along the front surface of the coating film with the substrate being rotated, and wherein an amount of solvent supplied when the contact body is located at a peripheral portion of the substrate is larger than the amount when the contact body is located at a central portion of the substrate.

4. The substrate processing method as set forth in claim 2, wherein in said intermediate hardening step, the coating film is hardened so that the contact body is capable of trimming the coating film in said planarization step and the coating film never dissolves by the supply of the solvent.

5. The substrate processing method as set forth in claim 1, wherein in said planarization step, the contact body is moved along the front surface of the coating film with the substrate being rotated, and wherein the contact body is moved from a central position of the substrate to a position at a peripheral portion where an edge portion of the substrate comes into contact with the contact body.

6. The substrate processing method as set forth in claim 1, wherein in said planarization step, the contact body is moved along the front surface of the coating film with the substrate being rotated and the contact body is reciprocated between a central portion and an end portion of the substrate, and wherein when the planarization by the contact body is finished, the contact body is moved to the outside of the substrate with the contact body kept pressed against the front surface of the coating film and the contact body is then separated from the substrate.

7. The substrate processing method as set forth in claim 1, wherein said planarization step comprises a cleaning step of cleaning the substrate front surface after planarization, and
wherein said cleaning step comprises a step of discharging a solvent for the coating solution to a center of the substrate with the substrate being rotated, and then blowing a nitrogen gas or an inert gas to the center of the substrate to remove a solution film at a central portion of the substrate.

8. The substrate processing method as set forth in claim 1, wherein the substrate on which the thin coating film is formed is heated.

9. The substrate processing method as set forth in claim 1, wherein in said planarization step, the coating film is planarized such that a thin coating film is left on a finally formed target flat surface, and
wherein the thin coating film is removed by etching after said final hardening step.

10. The substrate processing method as set forth in claim 1, further comprising:
    a second heating step of heating the substrate for which said planarization step has been finished.

11. The substrate processing method as set forth in claim 10, wherein at least any one of a third high-temperature heating step of heating the substrate at a temperature higher than the temperature in said second heating step and an ultraviolet irradiation step of irradiating the substrate with ultraviolet rays is performed after said second heating step.

12. The substrate processing method as set forth in claim 1, wherein in said planarization step, the coating film is planarized by the contact body in a sponge form.

13. The substrate processing method as set forth in claim 1, wherein said first coating step is a step of applying an insulating material to a base formed with an element isolation trench.

14. The substrate processing method as set forth in claim 1, wherein said first coating step is a step of applying an insulating material to a base formed with an electronic element.

15. The substrate processing method as set forth in claim 1, wherein said first coating step is a step of applying an insulating material to a base formed with a metal wiring.

* * * * *